United States Patent [19]
Maehara et al.

[11] Patent Number: 5,889,758
[45] Date of Patent: Mar. 30, 1999

[54] REFLECTION TYPE MASK STRUCTURE AND EXPOSURE APPARATUS USING THE SAME

[75] Inventors: Hiroshi Maehara; Masami Tsukamoto, both of Yokohama, Japan

[73] Assignee: Canon Kabushiki Kaisha, Tokyo, Japan

[21] Appl. No.: 801,463

[22] Filed: Feb. 18, 1997

[30] Foreign Application Priority Data

Feb. 20, 1996 [JP] Japan ........................... 8-03237

[51] Int. Cl.$^6$ ..................................................... H01L 21/30
[52] U.S. Cl. ................................................. 378/35; 378/34
[58] Field of Search ............................. 378/34, 35

[56] References Cited

U.S. PATENT DOCUMENTS

| | | | |
|---|---|---|---|
| 5,375,157 | 12/1994 | Maehara | 378/35 |
| 5,469,489 | 11/1995 | Miyake et al. | 378/34 |
| 5,485,495 | 1/1996 | Miyachi et al. | 378/35 |
| 5,485,497 | 1/1996 | Oizumi et al. | 378/84 |
| 5,553,110 | 9/1996 | Sentoku et al. | 378/35 |
| 5,593,800 | 1/1997 | Fujioka et al. | 430/5 |

*Primary Examiner*—David P. Porta
*Attorney, Agent, or Firm*—Fitzpartick, Cella, Harper & Scinto

[57] ABSTRACT

A reflection type X-ray mask structure includes an X-ray absorptive material pattern, an X-ray reflective multilayered film for reflecting X-rays, and a supporting substrate for supporting the X-ray reflective multilayered film, wherein an X-ray reflectivity of a portion other than a pattern region is lower than that of the pattern region. With this reflection type X-ray mask structure, step-and-repeat exposure or step-and-scan exposure with a semiconductor exposure apparatus does not cause undesirable multiple exposure at a boundary portion between juxtaposed exposure regions on a wafer.

15 Claims, 6 Drawing Sheets

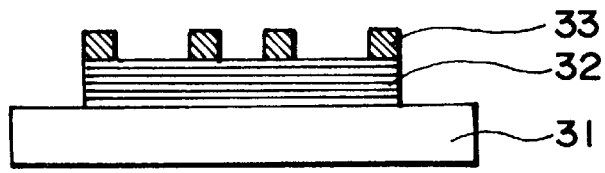
F I G. 1
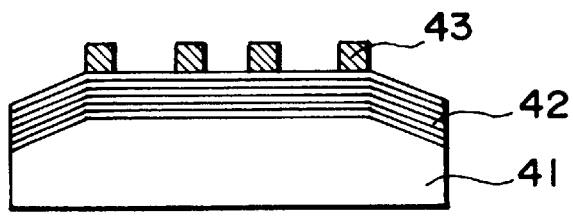
F I G. 2
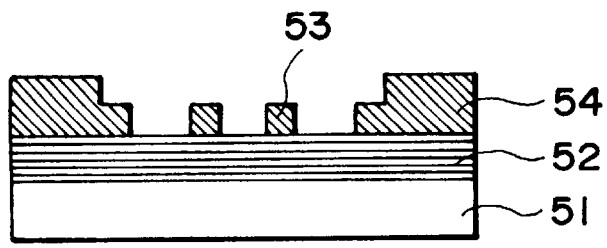
F I G. 3
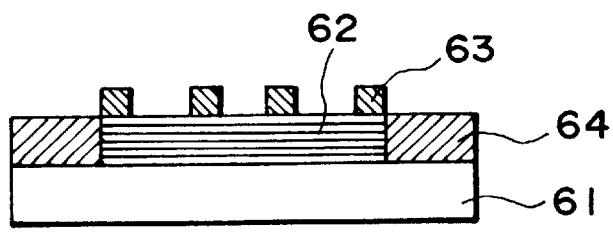
F I G. 4

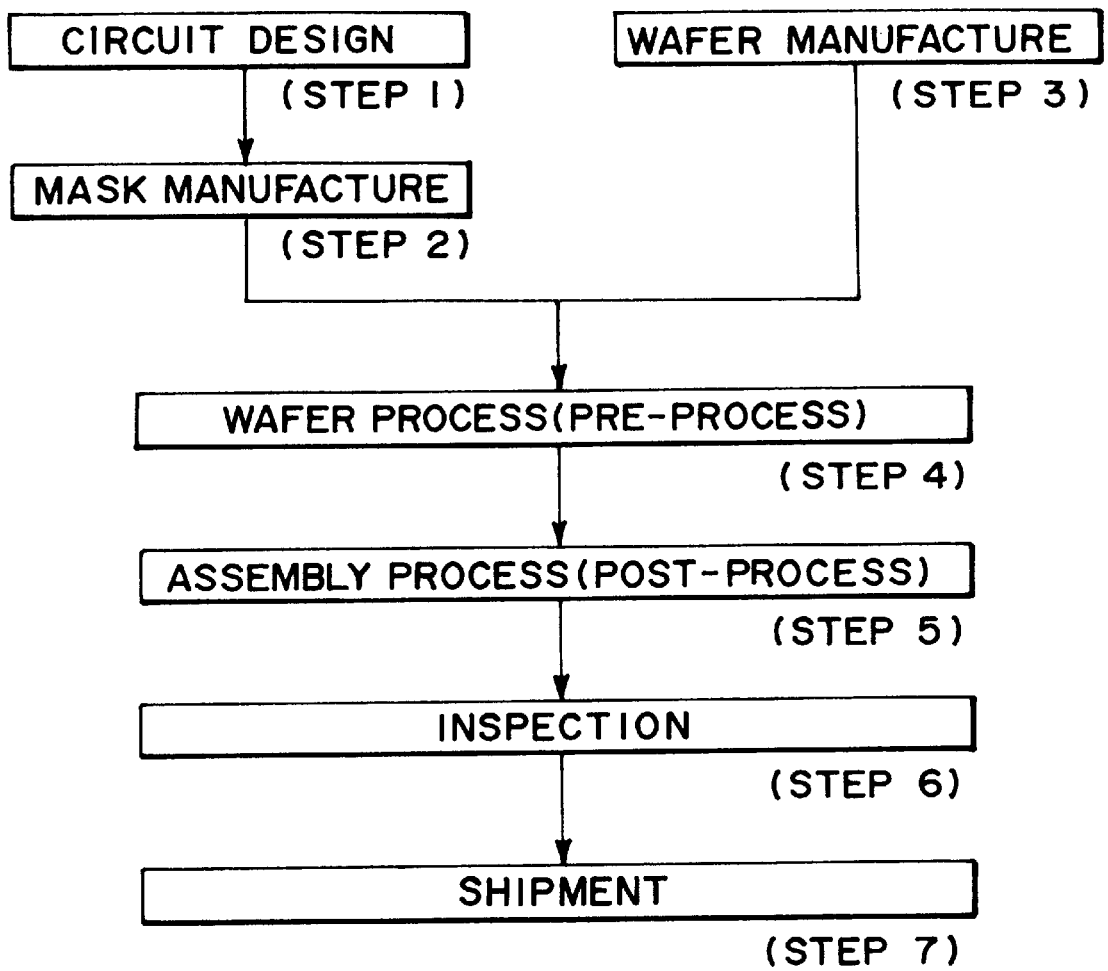
F I G. 8

REFLECTION TYPE MASK STRUCTURE AND EXPOSURE APPARATUS USING THE SAME

FIELD OF THE INVENTION AND RELATED ART

This invention relates to a reflection type mask structure and, more particularly, to a reflection type X-ray mask structure for use in a lithographic process for printing a fine pattern such as a pattern of a large scaled integrated circuit (LSI), a micro-machine or a micro-optics, for example, upon a substrate such as a wafer through X-ray exposure. In another aspect, the invention is concerned with an X-ray exposure apparatus and X-ray exposure method using such reflection type X-ray mask structure and, also, to a device to be produced by using such reflection type X-ray mask structure.

Pattern line width of a semiconductor integrated circuit has been reduced by 70% in the last three years to meet increases in density and speed of the integrated circuit, and it is still being reduced. Such large capacity memory device is transferred from a mask to a semiconductor substrate by using light such as near ultraviolet light, ultraviolet light or deep ultraviolet light, for example. However, with the wavelength regions of these lights, possible printing line width of a semiconductor device is going to reach the limit.

It is therefore desired to use a lithographic procedure based on X-rays having a wavelength shorter than these lights, to overcome the problems in resolution described above. Particularly, an X-ray exposure process using soft X-rays of a wavelength of about 40–130 Å enables X-ray reduction projection exposure with the use of an X-ray reflection optical system and a reflection type X-ray mask. Generally, a reflection type X-ray mask for use in such X-ray projection exposure for pattern transfer comprises an X-ray reflective multilayered film formed by alternately layering, on a substrate, a light element material having a smaller atomic number and a heavy element material having a larger atomic number, an X-ray blocking film pattern formed on the X-ray reflective multilayered film and for blocking X-rays, and a substrate material for supporting the X-ray reflective multilayered film.

As for a reflection type X-ray mask, generally the following materials are usable. First, as for light element materials for an X-ray reflective multilayered film, there are carbon (C), boron (B), and beryllium (Be), for example. As for heavy element materials, on the other hand, there are molybdenum (Mo), tungsten (W), rhodium (Rh), hafnium (Hf), and tantalum (Ta), for example. As for materials of X-ray blocking film pattern to be provided on the X-ray reflective multilayered film, there are tungsten (W), gold (Au), tantalum (Ta), and platinum (Pt), for example. As for materials of a support member for the X-ray reflective multilayered film, there are ceramic materials such as silicon carbide (SiC) and quartz ($SiO_2$), for example.

When a device pattern is printed sequentially upon different zones on a substrate, such as a silicon wafer, by using such a reflection type X-ray mask structure and an exposure apparatus (stepper) and in accordance with a step-and-repeat method or a step-and-scan method, it is possible that, as shown in FIG. 5B, boundary portions of juxtaposed exposure regions on the substrate are subjected to four exposures at the maximum. This may cause multiple X-ray exposures with X-rays reflected from a portion of the reflection type X-ray mask, other than the pattern region of the mask. FIG. 5A is a schematic plan view, showing one pattern transfer region and a range of illumination therefor, and FIG. 5B is a schematic plan view for explaining zones of multiple exposures during an X-ray exposure process. Denoted in these drawings at 11 is a pattern transfer region, and denoted at 12 is the illumination region outside the pattern transfer region 11. Denoted at 13 are multiple exposure zones wherein two exposures are effected. Denoted at 14 are multiple exposure zones wherein four exposures are effected.

In an X-ray reduction projection exposure apparatus having a reduction projection optical system and using a reflection type mask, practically it is difficult to use blade means, for example, to restrict the illumination region upon a mask.

Presence of such multiple exposure zones as described above deteriorates line width or shape of a resist pattern, which in turn reduces device processing precision considerably. If the spacing between juxtaposed exposure regions on the substrate is made large to avoid creation of multiple exposure zone, it causes a decrease of the number of devices to be formed on the substrate which in turn results in serious problems of reduced device productivity and increased cost of manufacture.

SUMMARY OF THE INVENTION

It is accordingly an object of the present invention to provide a reflection type X-ray mask structure having an arrangement that step-and-repeat exposure or step-and-scan exposure with a reduction projection type exposure apparatus does not produce such multiple exposures at boundary portions of juxtaposed exposure regions on a wafer that may cause a pattern fault.

It is another object of the present invention to provide an X-ray exposure apparatus or an X-ray exposure method for assuring high-density and satisfactory pattern transfer, by use of such a reflection type X-ray mask structure as described just above.

It is a further object of the present invention to ensure provision of a higher density device by use of a reflection type X-ray mask structure described just above.

In accordance with an aspect of the present invention, there is provided a reflection type X-ray mask structure having an X-ray absorptive material pattern, an X-ray reflective multilayered film and a supporting substrate for supporting the X-ray reflective multilayered film, wherein X-ray reflectivity of a portion other than a pattern region is lower than that of the pattern region.

In such reflection type X-ray mask structure, when a member to which a pattern is to be transferred comprises a positive type resist, equation (1) below may preferably be satisfied in relation to the ratio $r_p$ of reflection X-ray intensity of the portion (non-pattern region) other than the pattern region to the reflection X-ray intensity of the pattern region. When the member to which a pattern is to be transferred comprises a negative type resist, equation (2) below may preferably be satisfied in relation to the ratio $r_n$ of reflection X-ray intensity of the non-pattern portion to that of the pattern region.

$$r_p < E_{p0}/4E_{pop} \tag{1}$$

wherein $E_{pop}$ is the correct exposure amount for formation of a positive type resist pattern, and $E_{p0}$ is the minimum exposure amount which causes phenomenon of film thickness reduction during resist development.

$$r_n < E_{ni}/4E_{nop} \tag{2}$$

wherein $E_{nop}$ is the correct exposure amount for formation of a negative type resist pattern, and $E_{ni}$ is the minimum exposure amount which causes phenomenon of film remaining after resist development.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and sectional view of an example of reflection type X-ray mask structure according to the present invention.

FIG. 2 is a schematic and sectional view of another example of reflection type X-ray mask structure according to the present invention.

FIG. 3 is a schematic and sectional view of a further example of reflection type X-ray mask structure according to the present invention.

FIG. 4 is a schematic and sectional view of a still further example of reflection type X-ray mask structure according to the present invention.

FIGS. 5A and 5B are schematic plan views, respectively, wherein FIG. 5A illustrates one pattern transfer region and an illumination region therefor, and FIG. 5B illustrates multiple exposure zones in an X-ray exposure process.

FIGS. 6A and 6B are graphs, respectively, for explaining examples of sensitivity curve of a resist used upon a substrate, to be exposed, during X-ray exposure process, wherein FIG. 6B shows a sensitivity curve of a positive type resist and FIG. 6B shows a sensitivity curve of a negative type resist.

FIG. 8 is a flow chart of semiconductor device manufacturing method according to an embodiment of the present invention.

DESCRIPTION OF THE PREFERRED EMBODIMENTS

Figure 5A:
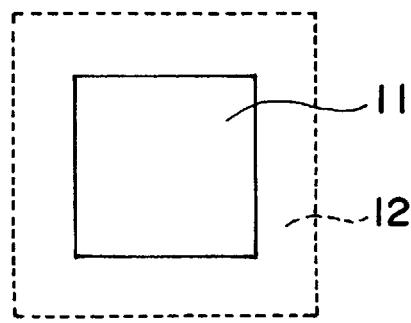
Figure 5B:
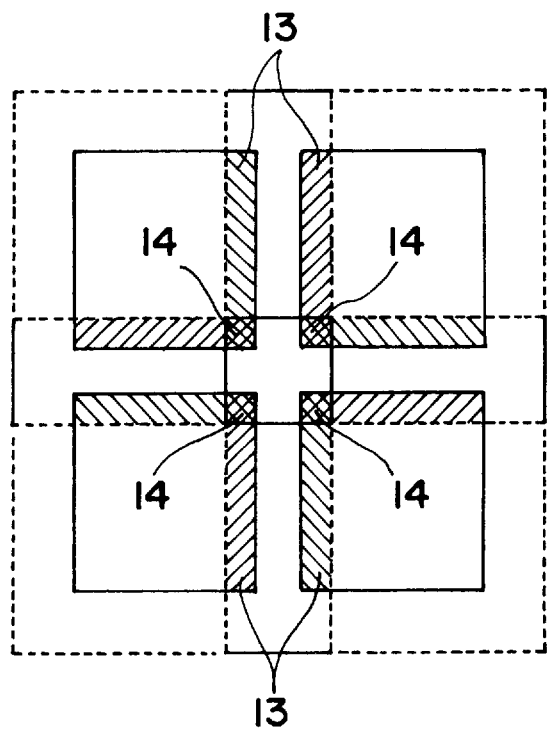

Basically, the present invention proposes to sufficiently decrease the X-ray reflectivity in a portion other than a pattern region (picture angle) of a reflection type X-ray mask. Here, such X-ray intensity that multiple exposure even with four superposed exposures, described with reference to FIG. 5B, can be neglected (i.e., it does not cause pattern fault), should be determined in consideration of dependency of variation in resist line width to the exposure amount or the amount of resist film reduction (called "film reduction amount") during a development process. Generally, it should preferably be not greater than a few percentages of the pattern region.

Figure 6A:
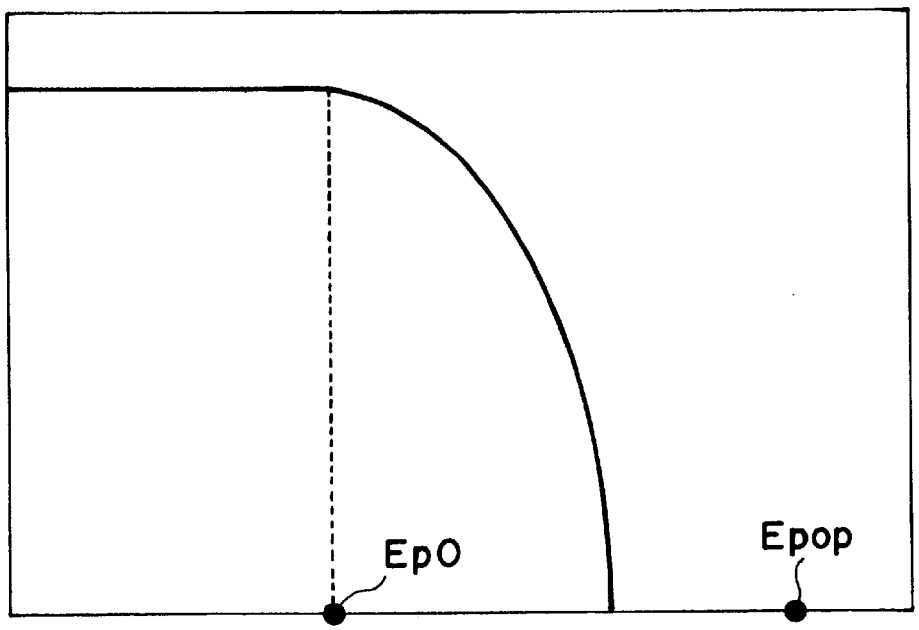

FIG. 6A shows an example, wherein a sensitivity curve of a positive type resist is illustrated. Now, the correct exposure amount for formation of a pattern of the resist to be used is $E_{pop}$, and the minimum exposure amount that causes film reduction of the resist during the development process is $E_{p0}$. The ratio of reflection X-ray intensity of a portion (non-pattern region) other than the pattern region to the reflection X-ray intensity of the pattern region is $r_p$. If the number of multiple exposures to be considered is four, as described hereinbefore, the ratio $r_p$ of the reflection X-ray intensity of the non-pattern region should preferably satisfy the condition as defined by equation (1) below:

$$r_p < E_{p0}/4E_{pop} \quad (1)$$

Figure 6B:
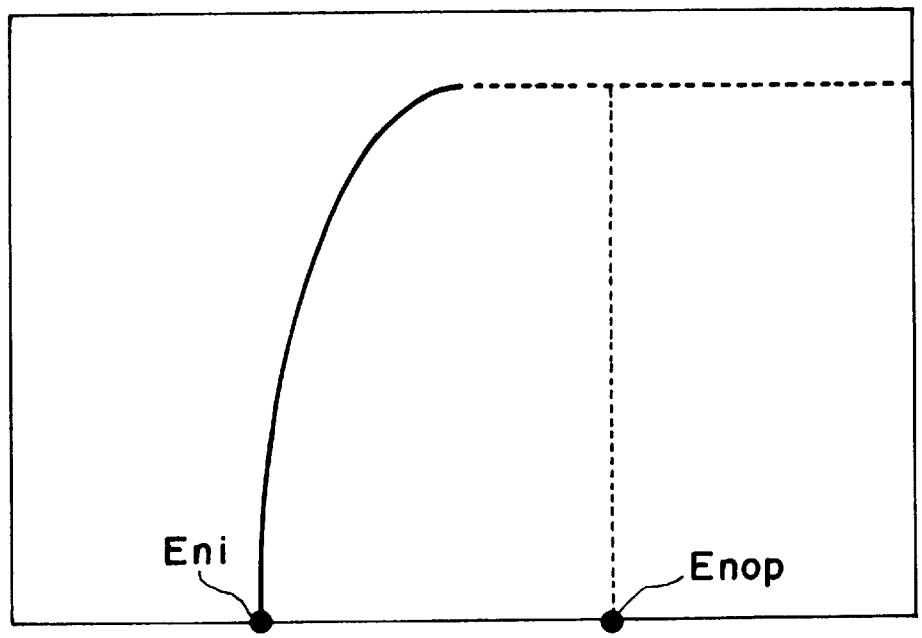

On the other hand, FIG. 6B shows another example wherein a sensitivity curve of a negative type resist is illustrated. Here, $E_{nop}$ is the correct exposure amount for formation of a pattern of the resist to be used, and $E_{ni}$ is the minimum exposure amount which causes phenomenon of film remainder after resist development. The ratio of reflection X-ray intensity of a non-pattern region, other than the pattern region, to the reflection X-ray intensity of the pattern region is $r_n$. The ratio $r_n$ should preferably satisfy the condition as defined by equation (2) below.

$$r_{n<Eni}/4E_{nop} \quad (2)$$

A first method for reducing X-ray intensity from the non-pattern region may be use of a mask structure wherein the boundary between the pattern region and the non-pattern region coincides with the boundary of presence of X-ray reflection multilayered film. It is the structure that an X-ray reflection multilayered film is formed only in the pattern region, and there is no X-ray reflection multilayered film in the non-pattern region. FIG. 1 shows an example of such X-ray mask structure. In FIG. 1, denoted at 31 is a mask supporting substrate, and denoted at 32 is an X-ray reflective multilayered film. Denoted at 33 is an X-ray absorptive material pattern.

A second method may be use of a mask structure wherein a pattern region and a non-pattern region are not on the same plane. The following examples may be included in such structure:

(a) A structure wherein a picture-angle region (pattern region) is being protruded upon a mask substrate;

(b) A structure wherein a picture-angle region is caved or recessed in a mask substrate; and (c) A structure wherein a portion around a picture-angle region is slanted (FIG. 2 example).

With the structures of examples (a), (b) and (c), while those X-rays as reflected by the picture-angle region go through a projection optical system, those X-rays as reflected by the portion around the picture-angle region do not go through the projection optical system. As a result, the reflection X-ray intensity changes largely at the boundary between the picture-angle region and the portion around it.

Particularly, with the structure of example (c), the incidence angle of projected X-rays varies at the portion other than the picture-angle region. Thus, the X-ray reflectivity changes largely between the picture-angle region and the portion around it. As a result of this, the X-ray intensity changes largely at the boundary of the picture-angle region. In FIG. 2, denoted at 41 is a mask supporting substrate, and denoted at 42 is an X-ray reflective multilayered film. Denoted at 43 is an X-ray absorptive material pattern.

A third method may be use of a mask structure wherein the thickness of X-ray absorptive material layer in a non-pattern region is larger than that of X-ray absorptive material layer of a pattern region. FIG. 3 shows an example of such structure. In FIG. 3, denoted at 51 is a mask supporting substrate, and denoted at 52 is an X-ray reflective multilayered film. Denoted at 53 is an X-ray absorptive material pattern, and denoted at 54 is an X-ray absorptive material which serves as a multiple exposure prevention layer.

In a structure according to the third method, the thickness of the X-ray absorptive material around the picture angle should be such that film reduction of a resist on a wafer or variation of line width does not occur even with multiple exposures of four, at maximum, as described hereinbefore. In a case of reduction projection exposure where a reflection type X-ray mask is used, the film thickness should be determined in consideration of interference condition and phase, including those of the X-ray absorptive material provided on the X-ray reflective multilayered film.

As an example, when X-rays of a wavelength 130 Å is used and the incidence angle to a mask is 5.8 deg., the reflectivity upon an X-ray reflective multilayered film may be 72.3%. When tungsten is used as an absorptive material and if the reflection X-ray intensity of a non-pattern portion should be not greater than 1/100 of the reflection X-ray intensity from an X-ray reflection multilayered film in a pattern region, the required film thickness of tungsten may be about 60 nm.

A fourth method may be use of a mask structure wherein a periodic structure of an X-ray reflective multilayered film of a non-pattern region is destroyed so that the X-ray reflectivity of that portion is lower than the X-ray reflectivity of a pattern region. FIG. 4 shows an example of such X-ray mask structure, wherein denoted at 61 is a mask supporting substrate and denoted at 62 is an X-ray reflective multilayered film. Denoted at 63 is an X-ray absorptive material pattern, and denoted at 64 is an X-ray non-reflective portion wherein multilayered structure is destroyed.

In a mask structure according to the fourth method, it is necessary that the periodic structure of the X-ray reflection multilayered film portion 64 in the non-pattern region does not satisfy Bragg's condition or it is out of optimum period.

Next, the manner of producing mask structures according to the present invention as described above, will be explained, in an order from the first mask structure.

In the first mask structure shown in FIG. 1, the portion other than the picture-angle region may be covered by using a mask means during film formation of its X-ray reflection multilayered film, to ensure that X-ray reflective multilayered film is deposited only in the picture-angle region. Alternatively, an X-ray reflective multilayered film may be formed on the whole surface of a mask substrate and, thereafter, the material on the portion other than the picture-angle region may be removed by etching.

In the second mask structure shown in FIG. 2, as for a substrate on which an X-ray reflection multilayered film is to be formed, a substrate wherein a picture-angle region is protruded or caved or a substrate wherein a portion around a picture-angle region is slanted may be prepared. Then, an X-ray reflection multilayered film may be formed at least in the picture-angle region of that substrate.

In the third mask structure shown in FIG. 3, an absorptive material film corresponding to the film thickness in a portion other than a picture-angle region, may be formed on an X-ray reflective multilayered film and, then, a pattern may be directly formed in the picture-angle region by etching. Alternatively, an absorptive material film corresponding to the film thickness in a portion other than a picture-angle region, may be formed on an X-ray reflective multilayered film and, thereafter, the whole of the region corresponding to the picture angle may be back-etched to the thickness of the pattern to be transferred. Finally, patterning of the picture-angle region may be performed.

In the fourth X-ray mask structure shown in FIG. 4, a portion of the substrate having an X-ray reflection multilayered film formed thereon, other than a picture-angle region, may be irradiated with an ion beam, for example, to change or destroy the periodic structure of multilayered film so that it does not satisfy Bragg's reflection condition. Thereafter, an X-ray absorptive material may be applied at least on to the picture-angle region, and the absorptive material film may be patterned by etching. Alternatively, a multilayered film may be formed upon a supporting substrate having a rough surface, so that it does not have a periodic structure satisfying Bragg's reflection condition.

Next, the invention will be described in more detail, with reference to some embodiments.

[Embodiment 1]

In this embodiment, a reflection type X-ray mask structure such as shown in FIG. 1 was made.

A quartz substrate of 250 mm square was prepared as a substrate for a reflection type X-ray mask. On that substrate, molybdenum and silicone were alternately layered with thicknesses of 3.1 nm and 3.6 nm, respectively, in accordance with RF magnetron sputtering method. As a result, a multilayered film for X-ray reflection, comprising eighty-layer pairs was obtained. At that time, as for the film formation region for that multilayered film, an outside portion was covered by using a mask means so that an inside region of 200 mm square on the substrate was defined for a pattern transfer region during X-ray exposure procedure, and the X-ray reflection multilayered film was formed only in such pattern region. Subsequently, an X-ray absorptive material pattern of tungsten of 150 nm thickness as well as alignment marks were formed on the multilayered film, in accordance with photolithographic process. Since a reflection type X-ray mask thus produced has an X-ray reflective multilayered film only in a pattern region (picture angle), step-and-repeat exposure or step-and-scan exposure with a semiconductor exposure apparatus does not cause multiple exposure at the boundary between juxtaposed exposure regions that may result in pattern fault.

[Embodiment 2]

A quartz substrate of 250 mm square was prepared as a substrate for a reflection type X-ray mask. On that substrate, molybdenum and carbon were alternately layered with thicknesses of 2.3 nm and 2.7 nm, respectively, in accordance with RF magnetron sputtering method. As a result, a multilayered film for X-ray reflection, comprising pairs of two hundred and fifty layers was obtained over the whole surface of the quartz substrate. On the other hand, for a resist to be actually used for wafer exposure in a semiconductor exposure apparatus, a positive type resist of polymethyl methacrylate (PMMA) was chosen. It is known that, for X-ray exposure of such resist with a wavelength 4.5 nm, film reduction starting exposure amount ($E_{p0}$) during development process is 50 mJ/cm$^2$ and correct exposure amount ($E_{pop}$) is 250 mJ/cm$^2$. Therefore, the ratio $r_p$ of reflection X-ray intensity of a non-pattern region to that of a pattern region is 0.05.

[Embodiment 3]

Similar to the second embodiment, an X-ray reflection multilayered film was formed over the whole surface of a quartz substrate. On the other hand, as for a resist to be used for wafer exposure in a semiconductor exposure apparatus, a negative type resist was chosen. It is known that, for X-ray exposure of such resist with a wavelength 4.5 nm, film reduction start exposure amount ($E_{ni}$) during development process is 5 mJ/cm$^2$ and correct exposure amount ($E_{nop}$) is 25 mJ/cm$^2$, the ratio $r_n$ of reflection X-ray intensity of a non-pattern region to that of a pattern region is 0.05.

[Embodiment 4]

In this embodiment, a reflection type X-ray mask structure such as shown in FIG. 2 was made.

A quartz substrate of 250 mm square was prepared as a substrate for a reflection type X-ray mask. The substrate had a peripheral portion slanted by an angle 5 deg. to the plane of a central portion of 200 mm square, of the substrate, corresponding to a pattern region. On that substrate, molybdenum and silicone were alternately layered with thicknesses of 3.1 nm and 3.6 nm, respectively, in accordance with RF magnetron sputtering method. As a result, a multilayered film for X-ray reflection, comprising eighty-layer pairs was obtained. In this mask structure, when X-rays of a wavelength of 13 nm are projected on the pattern region at the center of the substrate with an incidence angle of 5.8 deg., because of the difference in incidence angle between the pattern region and the non-pattern region, the X-ray reflection intensity in the non-pattern region becomes approximately equal to zero. As a result, step-and-scan exposure with a semiconductor exposure apparatus does not cause multiple exposure zones at the boundary of juxtaposed exposure regions of a wafer that may produce pattern fault.

[Embodiment 5]

For a mask used in the fourth embodiment, X-rays of broad bandwidth wavelengths were projected with an incidence angle 90 deg. to the pattern region at the center of the substrate. Because of the difference in incidence angle between the pattern region and the non-pattern region, X-rays of a wavelength of 13 nm were selectively reflected at the pattern region, while on the other hand X-rays of a wavelength of 13.6 nm were selectively reflected. The latter does not enter a reduction optical system, because of the difference in direction of reflection. As a result, step-and-scan exposure with a semiconductor exposure apparatus does not cause multiple exposure zones at the boundary of juxtaposed exposure regions on a wafer that may produce pattern fault. However, depending on the structure of a reduction optical system, there is a possibility that the light reflected by the non-patter region is projected on a wafer as stray light. In that occasion, the slant angle of the mask peripheral portion may be enlarged or, alternatively, an aperture means for restricting the exposure region may be provided in the X-ray optical system, before or after the reflection type X-ray mask.

[Embodiment 6]

A quartz substrate of 250 mm square was prepared as a substrate for a reflection type X-ray mask. On that substrate, molybdenum and silicone were alternately layered with thicknesses of 3.1 nm and 3.6 nm, respectively, in accordance with RF magnetron sputtering method. As a result, a multilayered film for X-ray reflection, comprising eighty-layer pairs was obtained. In the mask structure of this embodiment, when X-rays of a wavelength of 13 nm are projected on to a pattern region at the center of the substrate with an incidence angle of 5.8 deg., the reflectivity upon the X-ray reflection multilayered film is 72.3%.

When tungsten is used as an absorptive material and in a case where the film thickness of the absorptive material in the pattern region should be not greater than $\frac{1}{10}$ of the reflection intensity from the X-ray reflection multilayered film, or in a case where the reflection X-ray intensity of a non-pattern region should be not greater than $\frac{1}{100}$ of the reflection X-ray intensity from the X-ray reflection multilayered film within the pattern region, then the required tungsten film thickness is about 30 nm and about 60 nm, in respective cases. When the mask of this embodiment is used in a semiconductor exposure apparatus and the exposure process is performed, there does not occur multiple exposure zone at the boundary between juxtaposed exposure regions on a wafer that may produce pattern fault.

[Embodiment 7]

Similarly to the first embodiment, an X-ray reflection multilayered film may be formed on a mask substrate. Thereafter, a portion corresponding to a non-pattern region may be scanningly irradiated with a converged argon laser, by which multilayered structure of the X-ray reflection multilayered film may be destroyed and the function as an X-ray reflection surface may be lost. Subsequently, an X-ray absorptive material pattern of tungsten of a thickness 150 nm as well as alignment marks may be formed on the multilayered film in accordance with a photolithographic process. Since a reflection type X-ray mask produced in the manner described above has an X-ray reflection function only in the pattern region (picture angle), step-and-scan exposure with a semiconductor exposure apparatus does not produce multiple exposure zones at the boundary between juxtaposed exposure regions on a wafer that may cause pattern fault.

[Embodiment 7]

Figure 7:
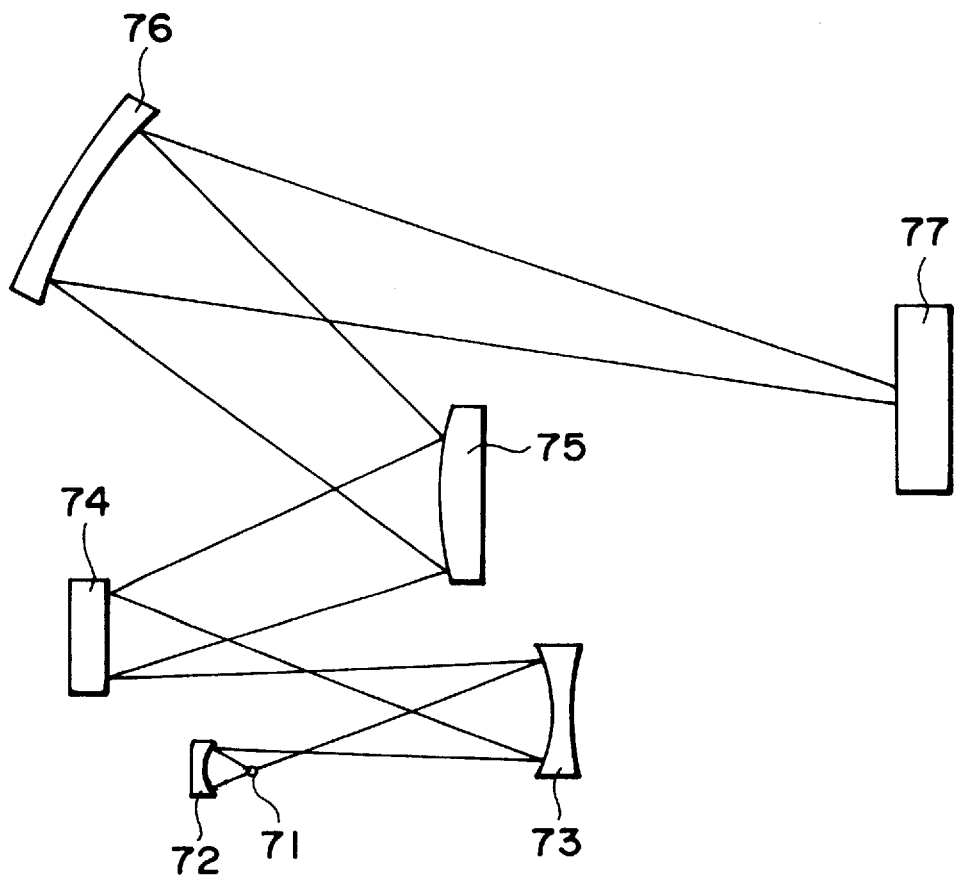
FIG. 7 is a schematic view of an X-ray exposure apparatus according to an embodiment of the present invention.

FIG. 7 shows an embodiment of a reduction exposure apparatus wherein a reflection type X-ray mask is used. Laser plasma X-ray source 71 is a radiation source which produces soft X-rays of a wavelength of 13 nm. Laser beam from the X-ray source 71 is collected by means of two reflection mirrors 72 and 73, and it irradiates a reflection type mask 74 which may be one of the mask structures described above. The laser beam having an intensity and a phase changed by the reflection type mask 74 is then reduced by an imaging optical system, comprising two reflection mirrors 75 and 76, and the mask pattern is lithographically transferred on to a resist applied to a wafer 77. Here, the reduction magnification is $\frac{1}{5}$ and the numerical aperture is 0.02, and a Schwaldshild optical system is provided. When reduction exposure is performed with this apparatus, multiple exposure is not substantially produced at the boundary between juxtaposed exposure regions on a wafer and, within the pattern region, pattern transfer fault does not occur. Also, the spacing between juxtaposed pattern regions on the wafer can be made small and, as a result, the number of devices that can be defined on the wafer increases.

[Embodiment 8]

Next, an embodiment of a semiconductor device manufacturing method which uses the exposure apparatus described above, will be explained.

FIG. 8 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicone. Step 4 is a wafer process which is called a pre-process wherein, by using the so prepared mask and wafer, circuits are practically formed on the wafer through lithography.

An X-ray mask of the present invention so prepared is loaded into an exposure apparatus. When the mask is conveyed and it is chucked by a mask chuck, since the pattern is in a predetermined region with respect to the apparatus, without mask alignment mark searching operation of an alignment unit, there is no error between the mask and the alignment unit.

Subsequently, a wafer is loaded and it is placed opposed to the mask. Any positional deviation between the mask and the wafer is detected by means of an alignment unit, and then a wafer stage is moved to accomplish alignment of the mask and the wafer. After the mask-to-wafer alignment is accomplished, the exposure process is performed. After the exposure process, the wafer is moved to a subsequent shot position, and the procedure from the alignment operation is repeated.

The procedure described above does not involve a searching operation of alignment unit as the mask is loaded. This has an advantage of enhancement of throughput.

Step 5 subsequent to the above is an assembling step which is called a post-process wherein the wafer processed by step 4 is formed into semiconductor chips. This step includes assembling (dicing and bonding) and packaging (chip sealing).

Step 6 is an inspection step wherein operability check, durability check and so on of the semiconductor devices produced by step 5 are carried out. With these processes, semiconductor devices are finished and they are shipped (step 7).

Figure 9:
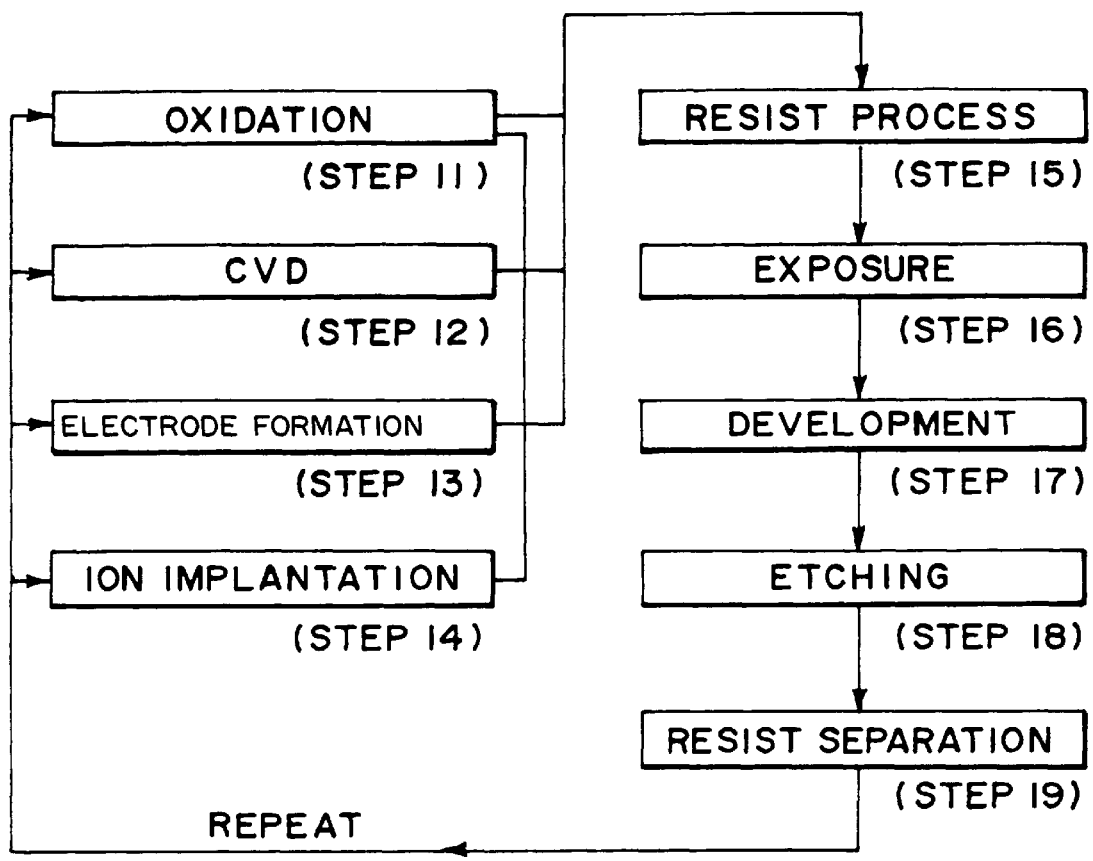
FIG. 9 is a flow chart of semiconductor device manufacturing method according to another embodiment of the present invention.

FIG. 9 is a flow chart showing details of the wafer process at step 4. Step 11 is an oxidation process for oxidizing the surface of a wafer. Step 12 is a CVD process for forming an insulating film on the wafer surface.

Step 13 is an electrode forming process for forming electrodes on the wafer by vapor deposition. Step 14 is an ion implanting process for implanting ions to the wafer. Step 15 is a resist process for applying a resist (photosensitive material) to the wafer.

Step 16 is an exposure process for printing, by exposure, the circuit pattern of the mask on the wafer through the exposure apparatus described above.

Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The device manufacturing method described above assures manufacture of higher density semiconductor devices.

While the invention has been described with reference to the structures disclosed herein, it is not confined to the details set forth and this application is intended to cover such modifications or changes as may come within the purposes of the improvements or the scope of the following claims.

What is claimed is:

1. A reflection type X-ray mask structure, comprising:

a supporting substrate having a transfer pattern forming region defined thereon;

an X-ray reflective multilayered film which covers at least the transfer pattern forming region of said supporting substrate; and an X-ray absorptive material pattern formed on a portion of said X-ray reflective multilayered film, wherein, on said supporting substrate, a region outside of the transfer pattern forming region has an X-ray reflection factor lower than that of the transfer pattern forming region.

2. A reflection type X-ray mask structure according to claim 1, wherein a material to which the pattern is to be transferred comprises a positive type resist, and wherein the ratio $r_p$ of reflection X-ray intensity of the outside region of the transfer pattern forming region to reflection X-ray intensity of the transfer pattern forming region satisfies the following relation:

$$r_p < E_{p0}/4E_{pop}$$

where $E_{pop}$ is the correct exposure amount for formation of a positive type resist pattern, and $E_{p0}$ is the minimum exposure amount which causes film reduction during resist development.

3. A reflection type X-ray mask structure according to claim 2, wherein the ratio $r_p$ is not greater than 0.1.

4. A reflection type mask structure according to claim 1, wherein a material to which a pattern is to be transferred comprises a negative type resist, and wherein the ratio $r_n$ of reflection X-ray intensity of the outside region of the transfer pattern forming region to reflection X-ray intensity of the transfer pattern forming region satisfies the following relation:

$$r_n < E_{ni}/4E_{nop}$$

where $E_{nop}$ is the correct exposure amount for formation of a negative type resist pattern, and $E_{ni}$ is the minimum exposure amount which causes film remainder after resist development.

5. A reflection type X-ray mask structure according to claim 4, wherein the ratio $r_n$ is not greater than 0.1.

6. A reflection type X-ray mask structure according to claim 1, wherein said X-ray reflective multilayered film is formed only in the transfer pattern forming region.

7. A reflection type X-ray mask structure according to claim 1, wherein the transfer pattern forming region is defined on a plane different from that of the outside region of the transfer pattern forming region.

8. A reflection type X-ray mask structure according to claim 1, wherein an X-ray absorptive material in the outside region of the transfer pattern forming region has a thickness larger than the thickness of an X-ray absorptive material in the transfer pattern forming region.

9. A reflection type X-ray mask structure according to claim 1, wherein the X-ray reflective multilayered film in the outside region of the transfer pattern forming region has no periodic structure.

10. A reflection type X-ray mask structure according to claim 9, wherein a portion of said supporting substrate other than a portion corresponding to the transfer pattern forming region has a rough surface and wherein an X-ray reflective multilayered film is formed on that rough surface.

11. A refection type X-ray mask structure according to claim 10, wherein the X-ray reflective multilayered film with no periodic structure is formed by irradiation with a charged-particle beam after formation of the X-ray reflective multilayered film.

12. An exposure apparatus, comprising:

means for projecting X-rays to a reflection type X-ray mask structure as recited in claim 1; and an optical system for projecting a pattern of the reflection type X-ray mask structure onto a substrate to be exposed.

13. An X-ray exposure method including transferring a pattern of a reflection type X-ray mask structure as recited in claim 1, to a substrate to be exposed, through an X-ray lithography process.

14. A device as manufactured by using a reflection type X-ray mask structure as recited in claim 1 and on the basis of a procedure for transferring a pattern of the reflection type X-ray mask structure on to a workpiece.

15. A reflection type X-ray mask structure, comprising:

a transfer pattern forming region provided by an X-ray reflective portion, wherein an X-ray absorptive pattern is formed on a portion of the X-ray reflective portion; and a region outside of the transfer pattern forming region, the outside region having an X-ray reflection factor smaller than that of the transfer pattern forming region.

* * * * *

UNITED STATES PATENT AND TRADEMARK OFFICE
CERTIFICATE OF CORRECTION

PATENT NO. : 5,889,758

DATED : March 30, 1999

INVENTORS : HIROSHI MAEHARA, ET AL.

It is certified that error appears in the above-identified patent and that said Letters Patent is hereby corrected as shown below:

ON THE COVER PAGE:

At item [30], Foreign Application Priority Data, "8-03237" should read --8-032377--.

IN THE DISCLOSURE:

COLUMN 3:

line 50, "exposure" should read --exposures--.

COLUMN 5:

line 9, "is" should read --are--; and
line 31, "Bragg's" should read --Bragg's reflection--.

COLUMN 7:

line 33, "non-patter" should read --non-pattern--; and
line 48, "on to" should read --onto--.

UNITED STATES PATENT AND TRADEMARK OFFICE
CERTIFICATE OF CORRECTION

PATENT NO. : 5,889,758

DATED : March 30, 1999

INVENTORS : HIROSHI MAEHARA, ET AL.

It is certified that error appears in the above-identified patent and that said Letters Patent is hereby corrected as shown below:

COLUMN 10:

line 3, "type" should read --type X-ray--; and
    line 38, "refection" should read --reflection--.

Signed and Sealed this

Ninth Day of November, 1999

Attest:

Q. TODD DICKINSON

Attesting Officer

Acting Commissioner of Patents and Trademarks